(12) United States Patent
Poole et al.

(10) Patent No.: US 9,638,773 B2
(45) Date of Patent: *May 2, 2017

(54) FERROMAGNETIC AUGMENTATION FOR MAGNETIC RESONANCE IMAGING

(71) Applicant: Hyperfine Research, Inc., Guilford, CT (US)

(72) Inventors: Michael Stephen Poole, Guilford, CT (US); Todd Rearick, Cheshire, CT (US); Jonathan M. Rothberg, Guilford, CT (US)

(73) Assignee: Hyperfine Research, Inc., Guilford, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/846,255

(22) Filed: Sep. 4, 2015

(65) Prior Publication Data

US 2016/0069972 A1    Mar. 10, 2016

Related U.S. Application Data

(60) Provisional application No. 62/174,666, filed on Jun. 12, 2015, provisional application No. 62/111,320, (Continued)

(51) Int. Cl.
*G01V 3/00*    (2006.01)
*G01R 33/38*    (2006.01)
(Continued)

(52) U.S. Cl.
CPC ......... *G01R 33/3804* (2013.01); *G01R 33/36* (2013.01); *G01R 33/3614* (2013.01);
(Continued)

(58) Field of Classification Search
CPC ............. G01R 33/445; G01R 33/3614; G01R 33/3802; G01R 33/3806; G01R 33/381;
(Continued)

(56) References Cited

U.S. PATENT DOCUMENTS 3,622,869 A    11/1971  Golay
3,735,306 A    5/1973   Kabler et al.
(Continued)

FOREIGN PATENT DOCUMENTS

WO    WO 2009/042131 A1    4/2009
WO    WO 2013/016639 A1    1/2013
WO    WO 2014/013257 A1    1/2014

OTHER PUBLICATIONS

International Search Report and Written Opinion mailed Dec. 8, 2015 in connection with International Application No. PCT/US2015/048515.
(Continued)

*Primary Examiner* — Daniel Miller
(74) *Attorney, Agent, or Firm* — Wolf, Greenfield & Sacks, P.C.

(57) ABSTRACT

In some aspects, a magnetic system for use in a low-field MRI system. The magnetic system comprises at least one electromagnet configured to, when operated, generate a magnetic field to contribute to a $B_0$ field for the low-field MRI system, and at least one permanent magnet to produce a magnetic field to contribute to the $B_0$ field.

26 Claims, 12 Drawing Sheets

Related U.S. Application Data filed on Feb. 3, 2015, provisional application No. 62/110,049, filed on Jan. 30, 2015, provisional application No. 62/046,814, filed on Sep. 5, 2014.

(51) Int. Cl.

| | | |
|---|---|---|
| *G01R 33/36* | (2006.01) | |
| *G01R 33/385* | (2006.01) | |
| *G01R 33/44* | (2006.01) | |
| *G01R 33/58* | (2006.01) | |
| *G01R 33/48* | (2006.01) | |
| *H01F 7/02* | (2006.01) | |
| *H01F 7/06* | (2006.01) | |
| *G01R 33/381* | (2006.01) | |
| *G01R 33/383* | (2006.01) | |
| *G01R 33/3875* | (2006.01) | |
| *G01R 33/54* | (2006.01) | |
| *G01R 33/56* | (2006.01) | |
| *G01R 33/34* | (2006.01) | |
| *G01R 33/422* | (2006.01) | |

(52) U.S. Cl.
CPC ........... *G01R 33/38* (2013.01); *G01R 33/381* (2013.01); *G01R 33/3802* (2013.01); *G01R 33/383* (2013.01); *G01R 33/385* (2013.01); *G01R 33/3806* (2013.01); *G01R 33/3852* (2013.01); *G01R 33/3854* (2013.01); *G01R 33/3856* (2013.01); *G01R 33/3858* (2013.01); *G01R 33/3875* (2013.01); *G01R 33/445* (2013.01); *G01R 33/48* (2013.01); *G01R 33/543* (2013.01); *G01R 33/546* (2013.01); *G01R 33/56* (2013.01); *G01R 33/5608* (2013.01); *G01R 33/58* (2013.01); *H01F 7/02* (2013.01); *H01F 7/06* (2013.01); *G01R 33/34007* (2013.01); *G01R 33/422* (2013.01)

(58) Field of Classification Search
CPC G01R 33/383; G01R 33/385; G01R 33/3852; G01R 33/3854; G01R 33/3856; G01R 33/3875; G01R 33/48; G01R 33/543; G01R 33/5608; G01R 33/58; H01F 7/02
See application file for complete search history.

(56) References Cited

U.S. PATENT DOCUMENTS

| | | | |
|---|---|---|---|
| 4,621,299 A | 11/1986 | Hill | |
| 4,638,252 A | 1/1987 | Bradshaw | |
| 4,675,609 A * | 6/1987 | Danby | H01F 7/0278 324/318 |
| 4,770,182 A * | 9/1988 | Damadian | A61B 5/0555 324/306 |
| 5,252,924 A * | 10/1993 | Sakurai | H01F 7/0278 324/319 |
| 5,490,509 A * | 2/1996 | Carlson | G01R 33/3875 324/309 |
| 5,864,236 A * | 1/1999 | Li | G01R 33/3806 324/319 |
| 6,157,278 A * | 12/2000 | Katznelson | G01R 33/3806 324/319 |
| 6,235,409 B1 | 5/2001 | Serafin et al. | |
| 6,267,830 B1 | 7/2001 | Groll | |
| 6,294,972 B1 * | 9/2001 | Jesmanowicz | G01R 33/3875 324/318 |
| 8,451,004 B2 | 5/2013 | Walsh | |
| 2002/0000806 A1* | 1/2002 | Nakamura | G01R 33/3815 324/315 |
| 2002/0050895 A1 | 5/2002 | Zuk et al. | |
| 2007/0216413 A1 | 9/2007 | Legall et al. | |
| 2007/0244385 A1 | 10/2007 | Satragno et al. | |
| 2008/0084209 A1 | 4/2008 | Seeber et al. | |
| 2009/0138058 A1 | 5/2009 | Cooke et al. | |
| 2010/0160817 A1 | 6/2010 | Parihar et al. | |
| 2010/0219833 A1* | 9/2010 | McGinley | G01R 33/383 324/318 |
| 2010/0302701 A1 | 12/2010 | Olliges | |
| 2011/0007445 A1 | 1/2011 | Blakes | |
| 2011/0025332 A1 | 2/2011 | Abele et al. | |
| 2011/0037467 A1 | 2/2011 | Tsuda | |
| 2012/0032767 A1 | 2/2012 | Iwasaki et al. | |
| 2012/0092009 A1 | 4/2012 | Zhang et al. | |
| 2012/0268117 A1 | 10/2012 | Romano et al. | |
| 2013/0116544 A1 | 5/2013 | Rey et al. | |
| 2013/0214612 A1 | 8/2013 | Bae | |
| 2014/0155732 A1 | 6/2014 | Patz et al. | |
| 2016/0069968 A1 | 3/2016 | Rothberg et al. | |
| 2016/0069975 A1 | 3/2016 | Rothberg et al. | |
| 2016/0169992 A1 | 6/2016 | Rothberg et al. | |
| 2016/0223631 A1 | 8/2016 | Poole et al. | |
| 2016/0231399 A1 | 8/2016 | Rothberg et al. | |
| 2016/0231402 A1 | 8/2016 | Rothberg et al. | |
| 2016/0231403 A1 | 8/2016 | Rothberg et al. | |
| 2016/0231404 A1 | 8/2016 | Rothberg et al. | |

OTHER PUBLICATIONS

International Search Report and Written Opinion for International Application No. PCT/US2015/048484 mailed Dec. 4, 2015.
International Search Report and Written Opinion for International Application No. PCT/US2015/048470 mailed Dec. 10, 2015.
U.S. Appl. No. 14/845,652, filed Sep. 4, 2015, Rothberg et al.
U.S. Appl. No. 15/049,309, filed Feb. 22, 2016, Rothberg et al.
U.S. Appl. No. 14/846,158, filed Sep. 4, 2015, Rothberg et al.
U.S. Appl. No. 15/132,617, filed Apr. 19, 2016, Rothberg et al.
U.S. Appl. No. 15/132,671, filed Apr. 19, 2016, Rothberg et al.
U.S. Appl. No. 15/132,703, filed Apr. 19, 2016, Rothberg et al.
U.S. Appl. No. 15/132,742, filed Apr. 19, 2016, Rothberg et al.
U.S. Appl. No. 15/091,971, filed Apr. 6, 2016, Poole et al.
PCT/US2015/048470, Dec. 10, 2015, International Search Report and Written Opinion.

* cited by examiner

FERROMAGNETIC AUGMENTATION FOR MAGNETIC RESONANCE IMAGING

RELATED APPLICATIONS

This application claims priority under 35 U.S.C. §119(e) to U.S. Provisional Patent Application Ser. No. 62/046,814, filed Sep. 5, 2014 and entitled "Low Field Magnetic Resonance Imaging Methods and Apparatus," U.S. Provisional Patent Application Ser. No. 62/111,320, filed Feb. 3, 2015 and entitled "Thermal Management Methods and Apparatus," U.S. Provisional Patent Application Ser. No. 62/110,049, filed Jan. 30, 2015 and entitled "Noise Suppression Methods and Apparatus," and U.S. Provisional Patent Application Ser. No. 62/174,666, filed Jun. 12, 2015 and entitled "Automatic Configuration of a Low Field Magnetic Resonance Imaging System," each of which is herein incorporated by reference in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to conventional MRI techniques that, for a given imaging application, may include the relatively high cost of the equipment, limited availability (e.g., difficulty and expense in gaining access to clinical MRI scanners), the length of the image acquisition process, etc.

The trend in clinical MRI has been to increase the field strength of MRI scanners to improve one or more of scan time, image resolution, and image contrast, which in turn drives up costs of MRI imaging. The vast majority of installed MRI scanners operate using at least at 1.5 or 3 tesla (T), which refers to the field strength of the main magnetic field B0 of the scanner. A rough cost estimate for a clinical MRI scanner is on the order of one million dollars per tesla, which does not even factor in the substantial operation, service, and maintenance costs involved in operating such MRI scanners.

Additionally, conventional high-field MRI systems typically require large superconducting magnets and associated electronics to generate a strong uniform static magnetic field (B0) in which a subject (e.g., a patient) is imaged. Superconducting magnets further require cryogenic equipment to keep the conductors in a superconducting state. The size of such systems is considerable with a typical MRI installment including multiple rooms for the magnetic components, electronics, thermal management system, and control console areas, including a specially shielded room to isolate the magnetic components of the MRI system. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but is impractical or impossible due to the above-described limitations and as discussed in further detail below.

SUMMARY

The main magnetic field $B_0$ for use in magnetic resonance imaging is conventionally generated using electromagnets and, typically, exclusively so. However, electromagnets require power to operate the electromagnet to produce a magnetic field. The inventors have recognized that permanent magnets, which generate their own magnetic field, may be utilized to assist in the production of one or more magnetic fields, for example, the $B_0$ field for a low-field MRI system, to increase the field strength and/or improve the homogeneity of the $B_0$ field.

In this respect, some embodiments include a magnetic system for use in a low-field MRI system, the magnetic system comprising at least one electromagnet configured to, when operated, generate a magnetic field to contribute to a $B_0$ field for the low-field MRI system, and at least one permanent magnet to produce a magnetic field to contribute to the $B_0$ field.

Some embodiments include a method of providing a $B_0$ field suitable for low-field magnetic resonance imaging, the method comprises operating at least one electromagnet to generate a magnetic field to contribute to the $B_0$ field, and using at least one permanent magnet to produce a magnetic field to contribute to the $B_0$ field.

BRIEF DESCRIPTION OF THE DRAWINGS

Various aspects and embodiments of the disclosed technology will be described with reference to the following figures. It should be appreciated that the figures are not necessarily drawn to scale.

DETAILED DESCRIPTION

Figure 1A:
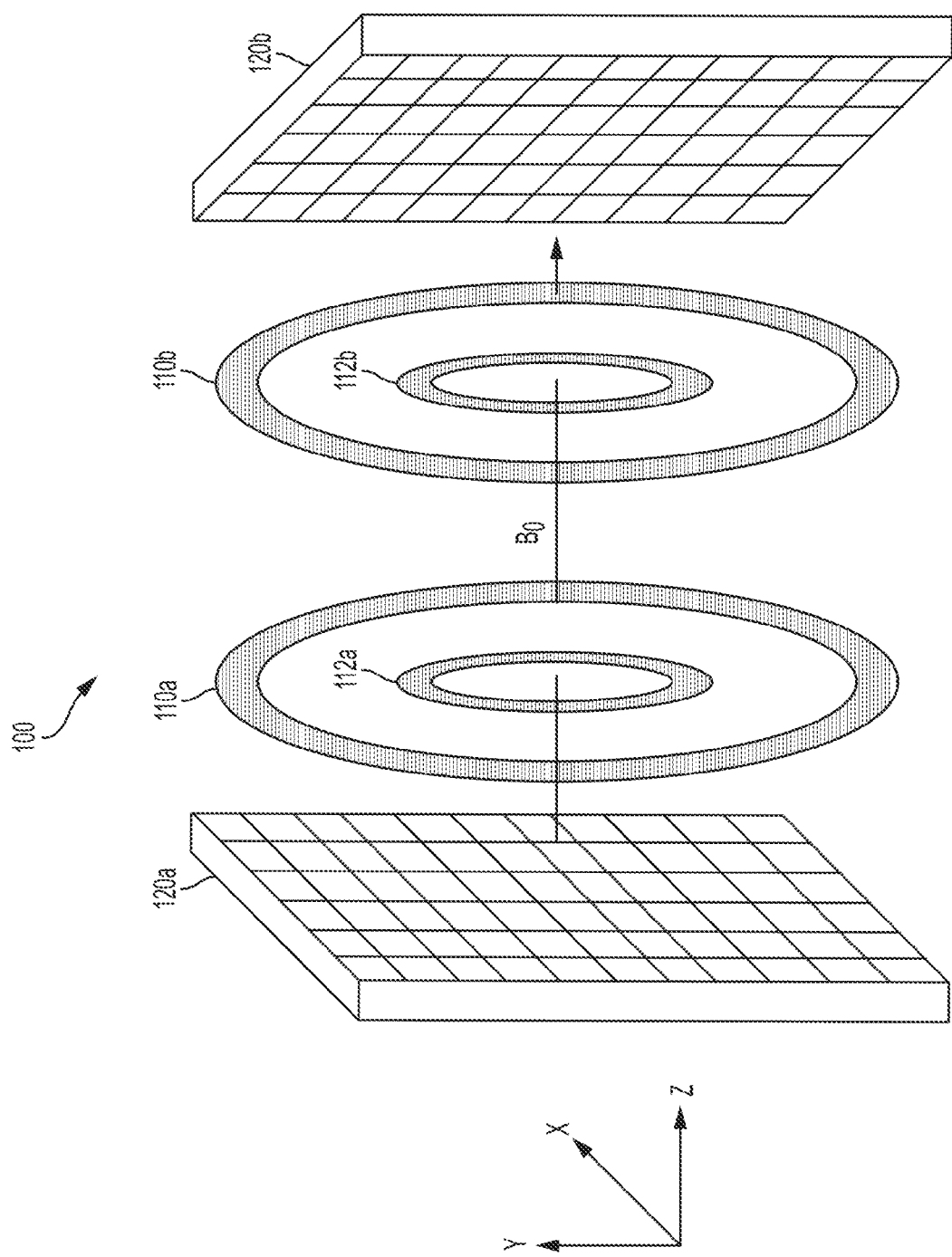
FIG. 1A is a schematic illustration of a low-field MRI system using a bi-planar magnet configuration.

The MRI scanner market is overwhelmingly dominated by high-field systems, and is exclusively so for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are generally also considered "high-field." By contrast, "low-field" refers generally to MRI systems operating with a $B_0$ field of less than or equal to approximately 0.2 T.

The appeal of high-field MRI systems include improved resolution and/or reduced scan times compared to lower field systems, motivating the push for higher and higher field strengths for clinical and medical MRI applications. However, as discussed above, increasing the field strength of MRI systems yields increasingly more expensive and complex MRI scanners, thus limiting availability and preventing their use as a general purpose and/or generally available imaging solution. As discussed above, contributing factors to the high cost of high-field MRI are expensive superconducting wires and the cryogenic cooling systems needed to keep the wires in a superconducting state. For example, the B0 magnet for high field MRI systems frequently employ superconducting wire that is not only itself expensive, but requires expensive and complicated cryogenic equipment to maintain the superconducting state.

Low-field MR has been explored in limited contexts for non-imaging research purposes and narrow and specific contrast-enhanced imaging applications, but is conventionally regarded as being unsuitable for producing clinically-useful images. For example, the resolution, contrast, and/or image acquisition time is generally not regarded as being suitable for clinical purposes such as, but not limited to, tissue differentiation, blood flow or perfusion imaging, diffusion-weighted (DW) or diffusion tensor (DT) imaging, functional MRI (fMRI), etc.

The inventors have developed techniques for producing improved quality, portable and/or lower-cost low-field MRI systems that can improve the wide-scale deployability of MRI technology in a variety of environments beyond the large MRI installments at hospitals and research facilities. Some aspects of the inventors' contribution derive from their recognition that a significant factor contributing to the cost and complexity of both high-field and low-field MRI is the magnetics components needed to produce MR signals that are useable for imaging applications as well as the power electronics needed to operate the magnetic components.

Briefly, MRI involves placing an object (e.g., all or a portion of a patient) to be imaged in a static, homogenous magnetic field $B_0$ to align atomic spins of atoms in the direction of the $B_0$ field. For high-field MRI systems, superconducting magnets made from coils of superconducting wire are generally required to achieve the homogeneity of $B_0$ at field strengths employed in high-field MRI. Not only are the superconducting magnets themselves costly, but they generally require cryogenic cooling during operation, increasing the cost and complexity of high-field MRI scanners. In addition to the $B_0$ magnetic component, gradient coils are provided to spatially encode MR signals from the object, and transmit and receive coils are provided to generate a magnetic field $B_1$ at a frequency related to the field strength of the magnetic field $B_0$ to cause atomic spins to change orientation and to detect MR signals emitted from the object upon realignment of the atomic spins with the magnetic field $B_0$, respectively. At high-field strengths and the associated high frequencies, these magnetic components are also relatively complex and expensive.

The inventor(s) have appreciated that low-field MRI systems do not require expensive superconducting magnets and/or the associated cryogenic cooling systems, and the reduced field strengths may facilitate reduction in the complexity and/or expense of other magnetic components in the system. Some examples of low-field MRI systems utilizing electromagnets are described in co-filed US Patent Application under Attorney Docket No. O0354.70004US01, filed Sep. 4, 2015 and titled "Thermal Management Methods and Apparatus," which is herein incorporated by reference in its entirety.

However, electromagnets require a power source to provide the necessary current to operate the respective electromagnet. For example, a relatively stable power source is required to drive the B0 coil(s) with suitable current to produce a B0 field with sufficient homogeneity, and gradient amplifiers are required to operate the gradient coils according to the desired characteristics. The power electronics of a low-field MRI system contribute substantially to the cost of the system, which cost increases at higher field strengths, both from a power consumption perspective and because of the cost of the components themselves.

In addition, as the power requirements increase with field strength, so does the cost and complexity of the thermal management system needed to transfer heat away from the components of the system. For example, magnetic components of low-field MRI systems generally do not employ superconducting materials and instead typically employ more conventional conducting materials (e.g., copper, aluminum, etc.) that generate heat when operated so that thermal management is typically required to dissipate heat generated by the MRI system (e.g., the magnetic components of the system). As the $B_0$ field strength is increased in the low-field range, the cost and complexity of the thermal management also increases. As such, the power requirements of the low-field MRI system play a substantial role in the cost and complexity of the low-field MRI system, both from the power electronics and thermal management perspective, and may limit the field strength attainable by the low-field MRI system.

The inventors have recognized that permanent magnets may be utilized to assist in the production of one or more magnetic fields of a low-field MRI system. A permanent magnet refers to any object that creates its own persistent magnetic field. Materials that can be magnetized as such are referred to herein as ferromagnetic and include, as non-limiting examples, iron, nickel, cobalt, alloys thereof, etc. Because a permanent magnet does not require a power source to generate a magnetic field, one or more permanent magnets may be used to contribute to the magnetic field without increasing the power requirements of the system. Thus, using a permanent magnet to contribute, for example, to a $B_0$ field, a $B_0$ field of desired strength may be produced with reduced power requirements (e.g., a $B_0$ field of less than or equal to approximately 10 mT, 20 mT, 0.1 T, 0.2 T, etc.).

Additionally, because ferromagnetic materials can be used to produce a higher $B_0$ field without a corresponding increase in power requirements, the use of permanent magnets may facilitate the construction of a low-field MRI system having a higher $B_0$ field without increasing the power requirements, with the potential of a low-field MRI system operating with a $B_0$ field in excess of 0.2 T (e.g., greater than or equal to 0.2 T and less than or equal to 0.3 T, or potentially higher field strengths below 0.5 T). According to some embodiments, at least one electromagnet and at least one permanent magnet are used to generate, at least in part, a $B_0$ field for a low-field MRI system.

The inventors have further appreciated that permanent magnets may be utilized to improve the homogeneity of a $B_0$ field used for MRI. In particular, one or more permanent magnets can be sized, shaped and/or arranged at locations such that their contributing magnetic fields support improved homogeneity. As such, permanent magnets may be utilized to not only contribute to the field strength, but also to the homogeneity of a $B_0$ field produced for use in, for example, low-field MRI.

Following below are more detailed descriptions of various concepts related to, and embodiments of, methods and apparatus for low field magnetic resonance applications including low-field MRI and the use of ferromagnetic materials in such systems. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

As discussed above, low-field MRI systems may address one or more of the problems associated with high-field MRI systems. For example, exemplary low-field MRI systems may be implemented without using superconducting magnets and consequently without the associated cryogenic cooling apparatus needed to maintain the $B_0$ magnet in a superconducting state, thereby significantly reducing the cost, complexity and size of the resulting MRI system. To produce a $B_0$ field having a magnetic field strength and magnetic field homogeneity suitable for high-field MRI, a solenoid coil formed of superconducting material is used wherein the $B_0$ field generated is in the direction of the axis through the center of the solenoid. As a result, imaging a patient requires placing the patient inside the solenoid coil. While the solenoid coil is particularly well-suited for generating a homogenous field at high field strengths, this geometry not only increases the size of equipment, but requires that a patient be inserted into a cylindrical bore to be imaged. Thus, this geometry may be unsuitable for patients with claustrophobia and may be incapable of accommodating large patients. Thus, the solenoid coil geometry generally required to produce a suitable $B_0$ magnet for high-field MRI has further limitations that prevent high-field MRI from being a practical and available general purpose imager.

FIG. 1A schematically illustrates a bi-planar electromagnet configured to produce, at least in part, a portion of a $B_0$ field suitable for low-field MRI imaging. The bi-planar electromagnet comprises two outer coils 110a and 110b and two inner coils 112a and 112b. When appropriate current is applied to the coils, a magnetic field is generated in the direction indicated by the arrow to produce a $B_0$ field having a field of view between the coils that, when designed and constructed appropriately, may be suitable for low-field MRI. The term "coil" is used herein to refer to any conductor or combination of conductors of any geometry having at least one "turn" that conducts current to produce a magnetic field, thereby forming an electromagnet.

It should be appreciated that the bi-planar geometry illustrated in FIG. 1A is generally unsuitable for high-field MRI due to the difficulty in obtaining a $B_0$ field of sufficient homogeneity for high-field MRI. The bi-planar $B_0$ magnet illustrated in FIG. 1A provides a generally open geometry, facilitating its use with patients who suffer from claustrophobia and may refuse to be imaged with conventional high-field solenoid coil geometries. Furthermore, the bi-planar design may facilitate use with larger patients as a result of its open design and, in some instances, a generally larger field of view possible at low-field strengths and homogeneity requirements.

Bi-planar $B_0$ magnet illustrated in FIG. 1A provides a much less complex and lower cost $B_0$ magnet then what is possible for high-field MRI. The inventors have appreciated that aspects of the magnet in FIG. 1A may be improved upon using laminate techniques to fabricate a $B_0$ magnet or portion thereof for use in low-field MRI. Suitable laminate techniques and systems that utilize laminate techniques are described in co-filed U.S. Patent Application under Attorney Docket No.: O0354.70000US01, filed Sep. 4, 2015 and titled "Low Field Magnetic Resonance Imaging Methods and Apparatus," which is herein incorporated by reference in its entirety. As one example, laminate techniques may be used to produce a $B_0$ magnet that replaces inner coils 112a and 112b to produce a desired $B_0$ field for low-field MRI. Examples of such hybrid techniques are described in the above incorporated co-filed application and discussed in further detail below.

In other embodiments, laminate techniques can be used to implement the $B_0$ magnet in its entirety. For example, according to some embodiments, a laminate panel comprises at least one conductive layer patterned to form one or more $B_0$ coils, or a portion of one or more $B_0$ coils, capable of producing or contributing to a $B_0$ magnetic field suitable for low-field MRI. For example, a laminate panel may comprise a plurality of concentric coils to form one "side" of the pair of bi-planar $B_0$ coils illustrated FIG. 1A. A second laminate panel may be similarly constructed to incorporate $B_0$ coils for the other "side" of the field of view in the bi-planar design. In this manner, magnetic components used to generate a $B_0$ field for a low-field MRI system may be constructed using laminate panel techniques.

FIG. 1A also schematically illustrates a pair of planar gradient coil sets 120a, 120b to generate magnetic fields to facilitate phase and frequency encoding for the portion of the low-field MRI system illustrated. As discussed above, MRI systems encode received MR signals by systematically varying the $B_0$ field in a known manner using gradient coils to encode the spatial location of received MR signals as a function of frequency or phase. For example, gradient coils may be configured to vary frequency or phase as a linear function of spatial location along a particular direction, although more complex spatial encoding profiles may also be provided by using nonlinear gradient coils. For example, a first gradient coil may be configured to selectively vary the $B_0$ field in a first (X) direction to perform frequency encoding in that direction, a second gradient coil may be configured to selectively vary the $B_0$ field in a second (Y) direction substantially orthogonal to the first direction to perform phase encoding, and a third gradient coil may be configured to selectively vary the $B_0$ field in a third (Z) direction substantially orthogonal to the first and second directions to enable slice selection for volumetric imaging applications.

Gradient coils are designed to operate with a specific $B_0$ magnetic component (e.g., one or more $B_0$ coils as shown in FIG. 1A) and, to operate satisfactorily, typically require relatively precise manufacture and subsequent alignment with the $B_0$ magnetic component. The inventors have recognized that using laminate techniques to fabricate one or more gradient coils (or portions thereof) may facilitate a simpler more cost effective approach to manufacturing magnetics components of a low field MRI system.

According to some embodiments, a laminate panel comprises at least one conductive layer patterned to form one or more gradient coils, or a portion of one or more gradient coils, capable of producing or contributing to magnetic fields suitable for providing spatial encoding of detected MR signals when operated in a low-field MRI apparatus. For example, the laminate panel may comprise one or more conductive layers patterned to form one or more X-gradient coils (or portions thereof), one or more Y-gradient coils (or portions thereof) and/or one or more Z-gradient coils (or portions thereof). The laminate panel forming one or more gradient coils (or portions thereof) may be separate from a corresponding $B_0$ magnetic component, or may be formed in one or more layers of a same laminate panel. With respect to the latter, the one or more gradient coils may be formed by conductive layers shared with (but electrically isolated from) the one or more $B_0$ coils (or portions thereof) or may be formed in one or more conductive layers separate from the one or more $B_0$ coils (or portions thereof). Integration of one or more gradient coils (or portions thereof) with one or more $B_0$ coils (or portions thereof) in a laminate panel may facilitate a simpler more flexible approach to designing and manufacturing magnetic components for low-field MRI, further aspects of which are discussed below.

A low field MRI system may further include additional magnetic components such as one or more shim coils arranged to generate magnetic fields in support of the system to, for example, increase the strength and/or improve the homogeneity of the $B_0$ field, counteract deleterious field effects such as those created by operation of the gradient coils, loading effects of the object being imaged, or to otherwise support the magnetics of the low field MRI system. When a shim coil is operated to contribute to the $B_0$ field of an MRI system (e.g., to contribute to the field strength and/or to improve homogeneity), the shim coil functions as a $B_0$ coil of the system and should be understood as such. In some implementations, one or more shim coils may be operated independently of other $B_0$ coils of the system, as discussed in further detail below.

Furthermore, a low field MRI system may further include shielding component(s) arranged to suppress unwanted electromagnetic radiation in the environment and/or between components. The inventor(s) have recognized that laminate techniques may be utilized to fabricate such components, for example, one or more shim coils (or portions thereof) and/or one or more shielding components, either by forming such components in separate laminate panel(s) or integrating such components in a laminate panel containing any one or combination of other magnetic components (or portions thereof) of a low field MRI system, as discussed in further detail below.

Accordingly, electromagnets for producing one or more magnetic fields needed to perform low-field MRI may be produced using conventional techniques (e.g., wound coils), may be fabricated using laminate techniques, or provided using a combination of both (e.g., using hybrid techniques). However, as discussed above, using electromagnets exclusively may have limitations related to the power requirements of the system, both with respect to the cost and complexity of the power electronics and/or the cost and complexity of the thermal management systems. The inventors have appreciated that that use of permanent magnets may address one or more problems associated with using electromagnets exclusively, as discussed in further detail below.

Figure 1D:
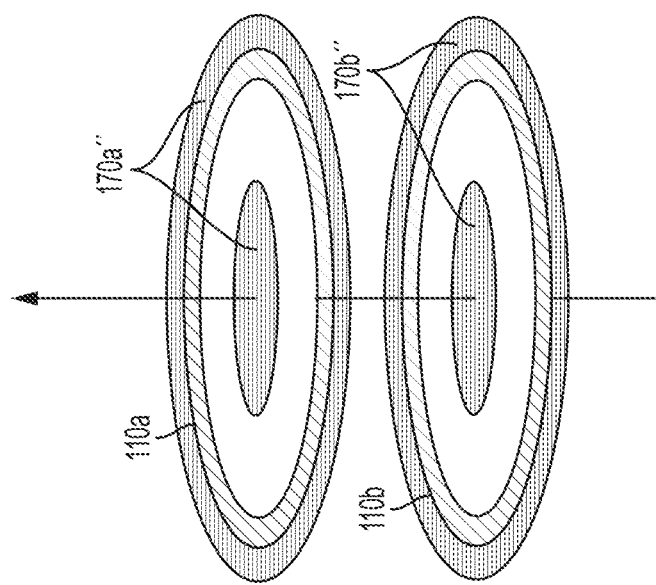
FIGS. 1B-1D illustrate magnets utilizing electromagnet(s) and permanent magnet(s), in accordance with some embodiments.
Figure 1C:
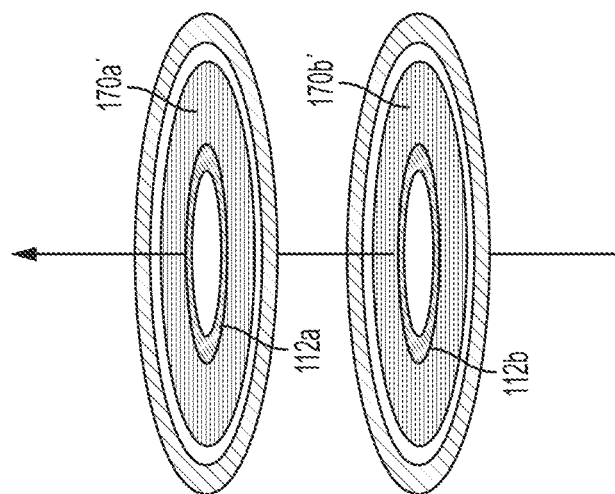
Figure 1B:
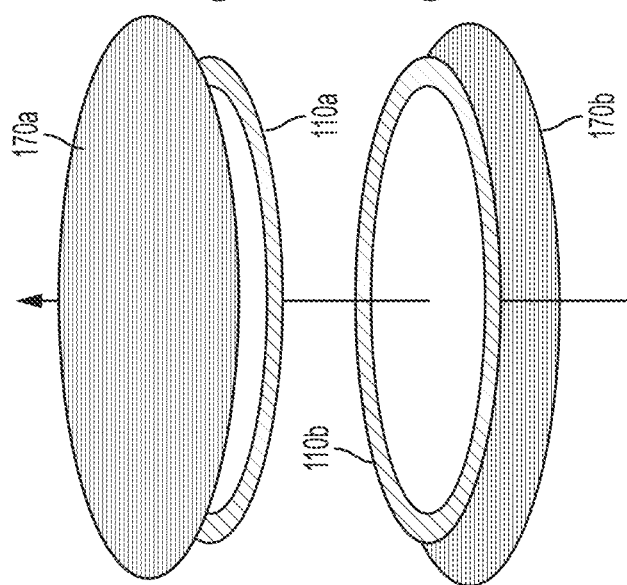

FIGS. 1B-D illustrate configurations of a bi-planar magnet using both electromagnets and permanent magnets to produce, at least in part, a $B_0$ field for low-field MRI. It should be appreciated that permanent magnets may also be utilized in any of the configurations illustrated in connection with a single-sided magnet, or in connection with a solenoid magnet, as the use of permanent magnets is not limited for use in connection with any particular type or geometry of electromagnet. For simplicity of illustration, the permanent magnets 170 illustrated in FIGS. 1B-D are schematically illustrated as circular magnets. However, permanent magnets of any shape may be used (e.g., rectangular, cylindrical, etc.). Additionally, each permanent magnet 170 may be a single integral magnet, or may comprise multiple magnets of any shape and size that are spatially distributed in any desired manner. Furthermore, the illustrated configurations are merely exemplary, as one or more permanent magnets may be utilized in any number, configuration and geometry to facilitate production of a desired $B_0$ field, as the aspects are not limited in this respect.

FIG. 1B illustrates a bi-planar magnet comprising electromagnets 110a and 110b and permanent magnets 170a and 170b. Permanent magnets 170a and 170b are arranged above and below electromagnets 110a and 110b, respectively, with respect to the field of view formed between the electromagnets. The permanent magnets provide a persistent magnet field that contributes to the $B_0$ field of an MRI system, allowing for the production of an increased strength $B_0$ field with little or no additional power requirements and/or allowing for reducing the power requirements needed to produce a $B_0$ field of a given field strength. In addition, the permanent magnets can be shaped, and/or multiple magnets may be arranged spatially, so as to improve the homogeneity of the $B_0$ field. Additionally or alternatively, permanent magnets may be provided in between electromagnets 110a and 110b, as the aspects are not limited in this respect. As discussed above, a single-sided magnet may be formed by removing one "side" of the bi-planar magnet illustrated (e.g., by removing electromagnet 110b and permanent magnet 170*b*). In this arrangement, permanent magnets can be arranged on either side of electromagnet 110*a*, or on both sides of electromagnet 110*a*. It should be appreciated that additional electromagnets (e.g., electromagnets 112*a,b* illustrated in FIG. 1A) and/or additional permanent magnets may be used, as the aspects are not limited in this respect.

FIG. 1C illustrates a bi-planar magnet comprising electromagnets 110*a*, 110*b* and 112*a*, 112*b* and permanent magnets 170*a*' and 170*b*'. Permanent magnet 170*a*' is arranged between and substantially concentric with electromagnets 110*a* and 112*a* and permanent magnet 170*b*' is arranged between and substantially concentric with electromagnets 110*b* and 112*b*. While permanent magnets 170*a*' and 170*b*' are illustrated as single integral magnets, respectively, the magnets may comprise any number of separate magnets spatially arranged as desired. FIG. 1D illustrates a bi-planar magnet comprising electromagnets 110*a*, 110*b* and permanent magnets 170*a*", 170*b*". Permanent magnets 170*a*" comprise one or more permanent magnets arranged outside and approximately concentric with electromagnet 110*a* and one or more permanent magnets arranged inside and approximately concentric with electromagnet 110*a*. Similarly, permanent magnets 170*b*" comprise one or more permanent magnets arranged outside and approximately concentric with electromagnet 110*b* and one or more permanent magnets arranged inside and approximately concentric with electromagnet 110*b*.

It should be appreciated that any of the configurations illustrated in FIGS. 1B-D may be utilized alone or in any combination. For example, one or more permanent magnets of any shape or size may be arranged concentrically and/or non-concentrically with respect to any number of electromagnets to produce, at least in part, a $B_0$ field for use in MRI, for example, a $B_0$ field suitable for low-field MRI. The shape, size and location of the one or more permanent magnets can be chosen to facilitate production of a $B_0$ field of desired strength and/or homogeneity, some additional examples of which are discussed in further detail below. It should be further appreciated that configurations illustrated in FIGS. 1B-D may be used in any combination with other techniques described herein.

Figure 2B:
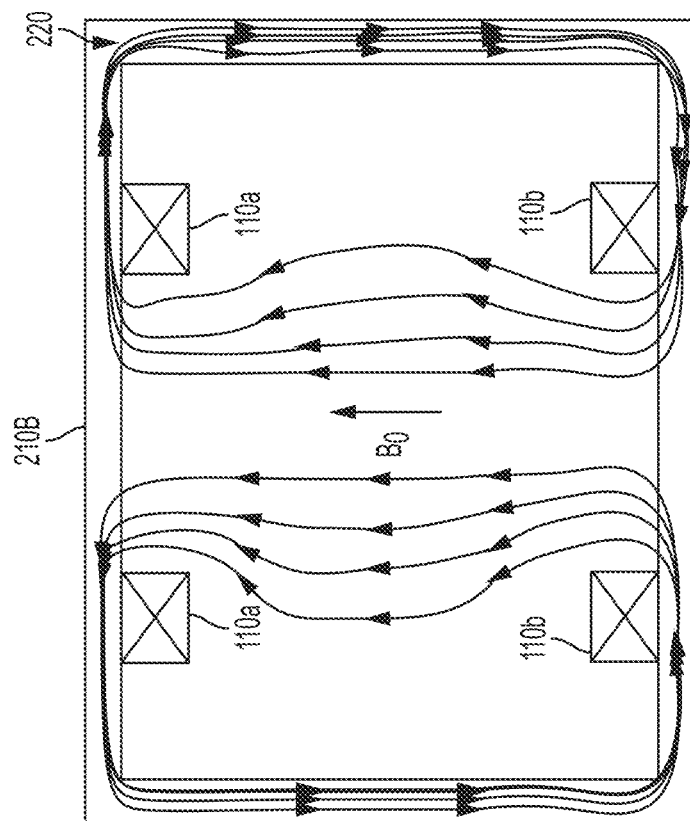
FIGS. 2A and 2B show a ferromagnetic yoke for use with a low-field MRI system in accordance with some embodiments.
Figure 2A:
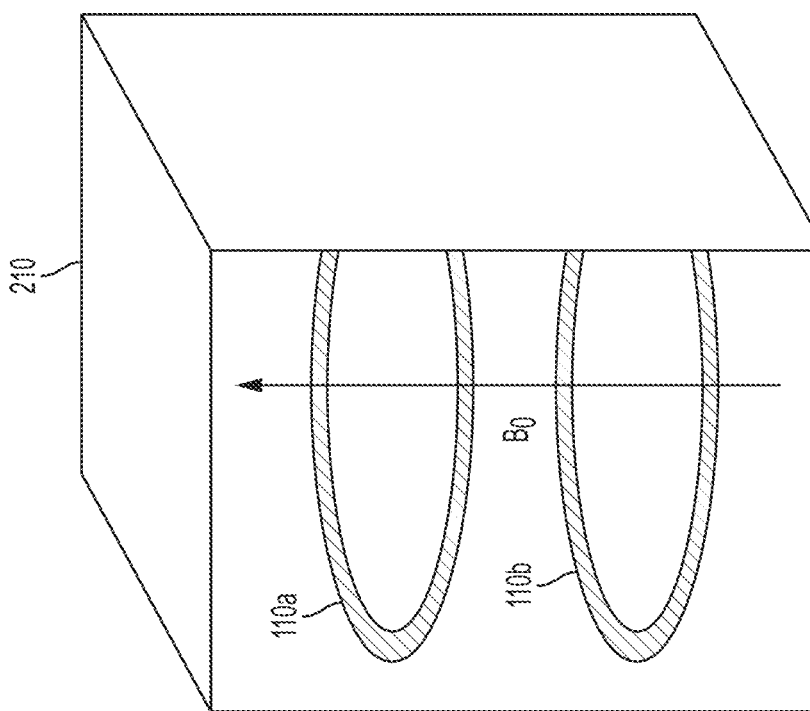

FIG. 2A schematically illustrates a bi-planar magnet geometry similar to of FIG. 1A in which coils 110*a* and 110*b* are formed within a yoke 210 to which the coils are connected. In the absence of yoke 210, half of the magnetic flux generated by the coils is lost to the surroundings. Yoke 210 includes ferromagnetic material (e.g., iron) that captures magnetic flux generated by one of the coils in the pair and returns the flux back to the other coil in the pair, thereby increasing, by up to a factor of two, the magnetic flux density in the imaging region between the pair of coils for the same amount of operating current provided to the coils. Any suitable ferromagnetic material or combination of ferromagnetic materials may be used and embodiments are not limited in this respect. FIG. 2B illustrates a cross-sectional view through yoke 210, which more clearly illustrates how magnetic flux 220 is circulated from the top coil 110*a* through yoke 210 to the bottom coil 110*b* to increase the flux density between the pair of coils.

The inventor(s) have recognized and appreciated that the magnetic flux generated by one of the coils may be captured and returned to the other coil using any of a number of ferromagnetic structures, and yoke 210, which forms a ferromagnetic box around the coils 110*a*, 110*b* is merely one implementation. Some examples of other alternate implementations are described in more detail below. Regardless of the type of ferromagnetic structure used, a complete connection between the outside of one coil in the pair and the outside of the other coil in the pair is needed to allow the magnetic flux to circulate in a closed loop in the ferromagnetic structure.

Figure 3:
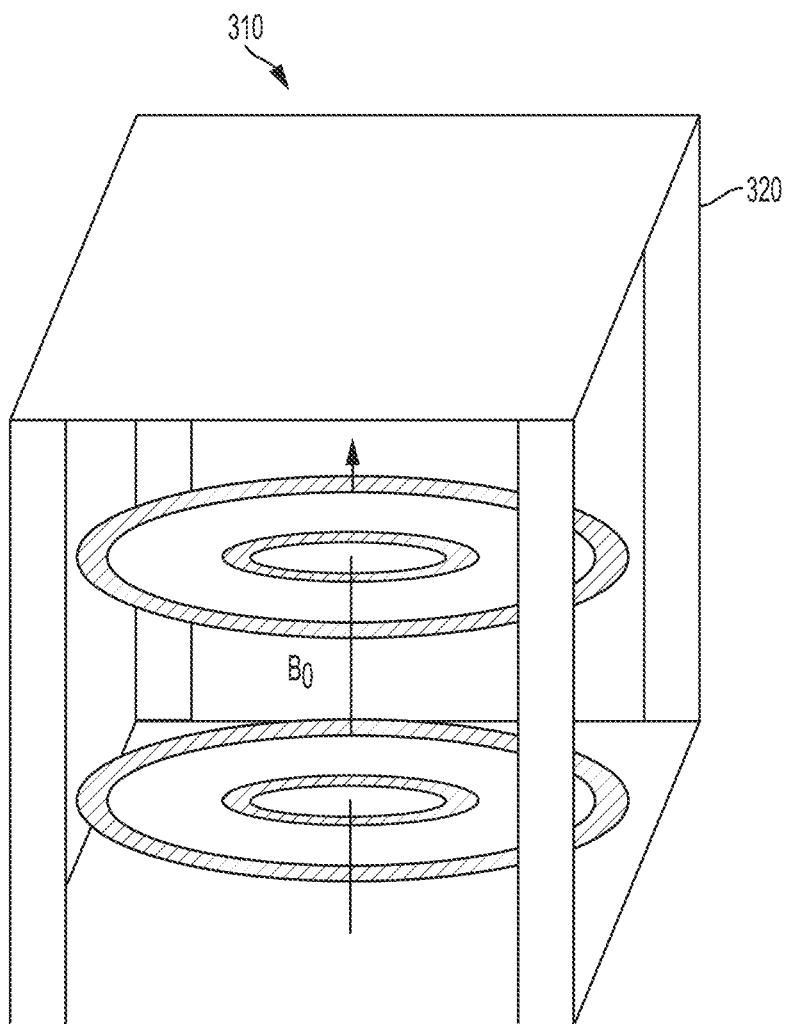
FIG. 3 shows an alternate ferromagnetic yoke for use with a low-field MRI system in accordance with some embodiments.

FIG. 3 shows an alternate ferromagnetic structure 310, in which yoke 210 has been replaced with a plurality of ferromagnetic posts 320 arranged to circulate the magnetic flux between the top and bottom coils of the pair of $B_0$ coils. The use of posts 320 improves access to the patient being imaged in the low field MRI scanner. In some embodiments, the posts may be movable to further improve access to the patient being imaged. Any number of posts 320 (including only two posts) may be used to provide a return path for magnetic flux in accordance with some embodiments. Additionally, any placement of the posts connecting the pair of $B_0$ coils may be used including an asymmetric positioning of the posts. In some embodiments, two posts arranged asymmetrically are used to provide return paths for magnetic flux generated by the coils.

Figure 4:
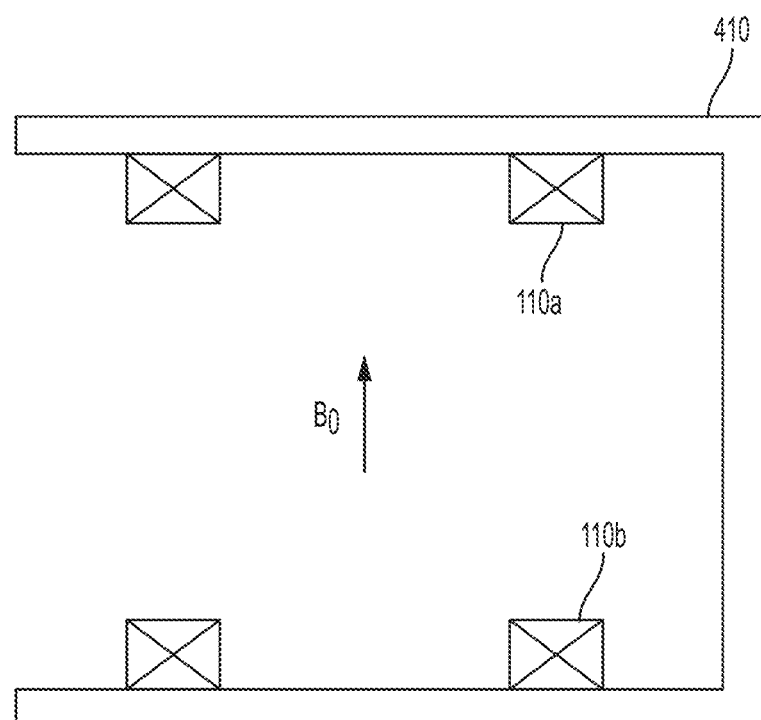
FIG. 4 shows a cross-section through a C-shaped ferromagnetic yoke for use with a low-field MRI system in accordance with some embodiments.

In the embodiments shown in FIGS. 2 and 3, the magnetic flux is returned through multiple paths (e.g., multiple sides of yoke 210 or multiple posts 320) of the ferromagnetic structure. Other embodiments include a ferromagnetic structure that allows a return path for magnetic flux only on one side of the structure. An example of a ferromagnetic structure where a return path for magnetic flux is provided only on one side of a bi-planar magnet in accordance with some embodiments is shown in FIG. 4. FIG. 4 shows C-shaped ferromagnetic structure 410, which captures magnetic flux from coil 110*a* and transfers the captured flux through structure 410 to coil 110*b*. Ferromagnetic structure 410 provides a similar magnetic flux density as yoke 210, and provides better access to a patient being imaged due to one of the sides of the structure being open. Although the use of C-shaped ferromagnetic structure 410 may result in a less homogeneous magnetic field compared to the design including yoke 210, the relative inhomogeneity of the field in the C-shaped design may be accommodated for in other ways including, but not limited to, the use of other electromagnetic or ferromagnetic components, discussed in more detail below.

The closed loop paths that return magnetic flux via one or more ferromagnetic structures in accordance with some embodiments form a magnetic circuit having a particular reluctance determined based on the ferromagnetic materials used and the geometry of the ferromagnetic structure(s) in relation to the return paths for the magnetic flux. The inventor(s) have recognized and appreciated that the ferromagnetic structure used to return magnetic flux will return the flux more efficiently (e.g., with less flux lost to the environment) if the return path for the flux has a lower reluctance. Accordingly, some embodiments reduce the reluctance of at least one magnetic flux return path to facilitate the flow of magnetic flux along the path in the magnetic circuit. Improving the efficiency with which flux is returned by reducing a reluctance in the magnetic circuit return path results in higher magnetic flux densities in the imaging region.

Figure 5:
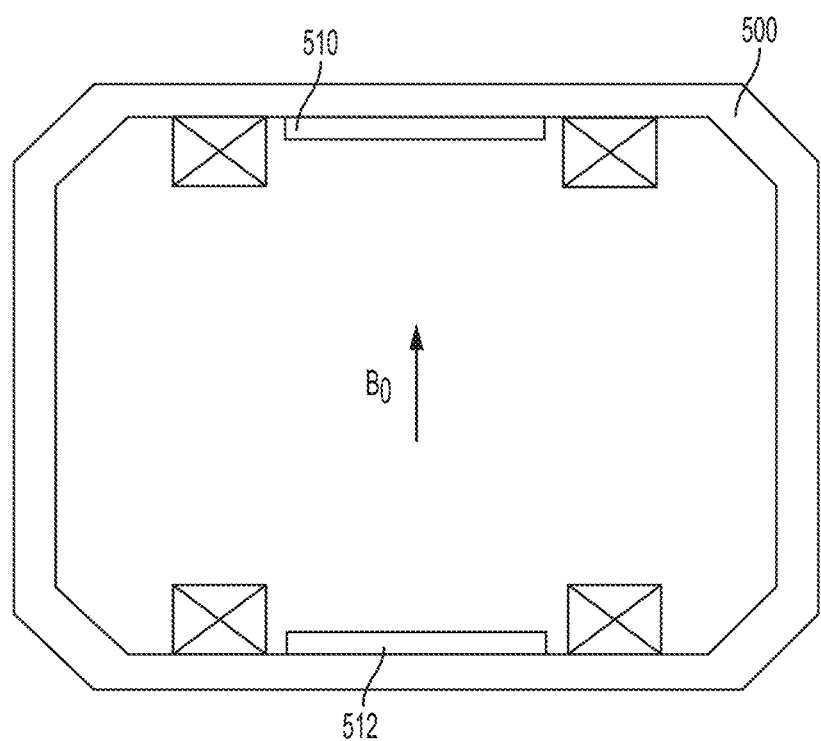
FIG. 5 shows a cross-section through a ferromagnetic augmentation device that includes electromagnetic coils in accordance with some embodiments.

The reluctance of the magnetic circuit is increased if the ferromagnetic material in the ferromagnetic structure saturates. Saturation may be influenced by several factors including, but not limited to, the type of ferromagnetic material used and the path the magnetic flux must travel in the material. For example, saturation may occur when the flux must change directions over short distances due to increased flux density as the flux bunches in the turn. An example of flux bunching along a return path is illustrated in the 90° corners of the yoke 210 shown in FIG. 2B. In some embodiments, one or more of the corners 500 of the ferromagnetic structure may be smoothed (e.g., beveled) as shown in FIG. 5 to reduce the magnetic reluctance at the corners of the ferromagnetic structure to prevent or reduce saturation at those points. The design of the ferromagnetic structure used to return flux may be modified in any other suitable way reduce the reluctance of the magnetic circuit, and aspects are not limited in this respect.

In addition to providing a return path for magnetic flux to increase the magnetic flux density within a field of view between the coils, some embodiments incorporate additional ferromagnetic components to correct and/or control the inhomogeneity of the $B_0$ field created by the coils. The homogeneity of the $B_0$ field may be improved using several different techniques, examples of which are discussed below.

As discussed above, some embodiments may include one or more electromagnetic shim coils in addition to the $B_0$ coils used to generate the $B_0$ field. The shim coils, when activated, allow for tuning of the $B_0$ field to compensate for inhomogeneity of the field. The shim coils may be static or may be energized dynamically (e.g., in response to control instructions from a computer processor) to provide additional flexibility in tuning the field. In some embodiments, shim coils arranged to facilitate the production of desired magnetic fields are patterned on one or more layers of a laminate panel. FIG. 5 illustrates a first laminate panel 510 and a second laminate panel 512, each of which includes one or more shim coils formed thereon. A particular implementation in which shim coils are formed on a laminate panel is described in more detail below. However, it should be appreciated that shim coils for use with embodiments may be formed in any other suitable way including, but not limited to, being wire wound, ribbon wound, and using electromagnetic coil(s) of any suitable shape.

According to some embodiments, a laminate panel may comprise at least one conductive layer patterned to form one or more shim coils, or a portion of one or more shim coils, arranged to produce or contribute to magnetic field(s) and adapted to improve the homogeneity of the $B_0$ field generated by one or more $B_0$ coils, to otherwise improve the $B_0$ field within a given field of view and/or to counteract other magnetic fields that negatively impact the $B_0$ field. For embodiments that include a laminate panel with at least one $B_0$ coil and at least one shim coil, the at least one shim coil may be formed by conductive layers shared with (but electrically isolated from) the at least one $B_0$ coil (or portions thereof) or may be formed in one or more conductive layers separate from the at least one $B_0$ coil (or portions thereof). As with the other magnetic components discussed above, shim coils fabricated using laminate techniques may be utilized with other components fabricated using laminate techniques (e.g., by integrating the shim coils in a shared or separate laminate panel) or utilized with other components manufactured using conventional techniques as part of a low field MRI system.

Multiple low-field MRI components (or portions thereof) may be formed on a single layer (i.e., a single laminate layer) of a laminate panel. That is, multiple magnetic components or portions of multiple magnetic components may be patterned on the same conductive layer of a single laminate layer. For example, a single laminate layer of a laminate panel may be patterned to form all or a portion of one or more $B_0$ coils and all or a portion of one or more shim coils used to tune the homogeneity of the $B_0$ field for the low-field MRI system. The shim coil(s) and the $B_0$ coil(s) (or portions thereof) may share at least some conductive elements formed on the laminate layer or the shim coil(s) and the $B_0$ coil (or portions thereof) may be formed separately on the same laminate layer (i.e., electrically isolated from one another). It should be appreciated that any combination of components (or portions thereof) may be similarly fabricated in one or more shared laminate layers as desired according to a specific design, as the aspects are not limited in this respect.

It should be appreciated that shim coils may be provided in any manner and configuration to contribute magnetic fields that facilitate the production of a $B_0$ field of desired strength and homogeneity. For example, shim coils may be patterned on a single layer or distributed across multiple layers, and each coil may be patterned on a layer alone or may share one or more layers with one or more other components, or portions thereof. Moreover, any number of shim coils having any desired geometry may be fabricated within a laminate panel, as the aspects are not limited in this respect. According to some embodiments, one or more shim coils are fabricated within a laminate panel separate from other magnetic components of a low field MRI system. According to some embodiments, shim coils may be provided in different geometries and/or locations such that different combinations of shims coils may be selectively activated in response to a given environment in which the system is being operated. The ability to dynamically choose a combination of shim coils to operate may facilitate the production of low field MRI systems capable of being deployed in a transportable or cartable fashion.

According to some embodiments, one or more laminate layers may include passive magnetic component(s), such as one or more layers patterned with magnetic materials, to facilitate the generation of a desired $B_0$ field with reduced power requirements, or to produce a higher B0 field using the same power requirements as needed without the use of magnetic materials. For example, a laminate panel may include one or more laminate layers patterned with ferrous, or other magnetic materials, arranged to form a magnetic component that contributes to the magnetic field generated by one or more $B_0$ coils to achieve a desired $B_0$ field. Because such magnetic materials produce and/or tailor a magnetic field without needing a power source to provide current to produce a magnetic field, a desired $B_0$ field may be produced with reduced power requirements, or an increased strength $B_0$ field may be produced with little or no increase in power requirements.

Magnetic component(s) formed on one or more laminate layers may include any one or combination of materials having relatively high magnetic permeability ($\mu$) to assist in producing and/or tailoring a $B_0$ field of desired field strength and/or homogeneity. Magnetic component(s) may be formed by one or more patterned layers, provided as a sheet, or other otherwise manufactured and incorporated within one or more laminate layers to produce a desired magnetic field. The use of passive magnetic components can reduce the power requirements needed to produce a given $B_0$ field. That is, because a portion of a desired $B_0$ can be produced passively (e.g., without requiring a power source to operate the components), the burden on the active magnetic components (e.g., the one or more a desired $B_0$ coils) can be reduced. As a result, one or more $B_0$ coils can be operated with reduced current to produce, in combination with magnetic component(s), a $B_0$ field having a desired field strength and/or homogeneity. Reducing the power requirements of the active magnetic components simplifies the cost and complexity of the power electronics driving the magnetic components, results in a corresponding reduction in the thermal output of the laminate panel, and also may otherwise ease the constraints on the active magnetic components in generating a $B_0$ field of desired strength and/or homogeneity.

As discussed above, ferromagnetic materials may be utilized to produce magnetic fields without requiring a source of power to do so. The ferromagnetic materials may be incorporated into one or more layers of a laminate panel or provided as a separate component used to increase the field strength and/or to alter the homogeneity of the $B_0$ field. When implemented using laminate techniques, one or more layers patterned with magnetic materials may be provided as passive shims to assist in producing the desired $B_0$ field. Passive shims (e.g., permanent magnet(s)) may be provided in any number, arrangement and geometry, and may be patterned on a single or multiple layers, either alone or on layers shared with one or more other components, as the aspects relating to providing passive shims are not limited to any particular configuration, geometry or arrangement. Passive shims may be provided using separate shim elements comprised of magnetic materials of any desired geometry. Such shim elements may be incorporated into a laminate panel by affixing the elements to the panel (e.g., using an adhesive or by other means of attachment) at desired locations and/or such shim elements may be arranged separate from the laminate panel at desired locations, as the aspects are not limited to any particular manner of incorporating one or more passive shims into a low-field MRI system.

As discussed above, ferromagnetic materials are used as passive shims in some embodiments to increase the field strength and/or improve the homogeneity of the $B_0$ field by incorporating the ferromagnetic materials in one or more layers of a laminate panel. Ferromagnetic powders, composites and/or micro-particle compounds may also be used to contribute to or alter the magnetic field of an MRI system. Additionally, or alternatively, ferromagnetic materials may be formed in components separate from laminate panel(s) to alter the homogeneity of the $B_0$ field. Examples of providing passive shim materials in different configurations in accordance with some embodiments, are described in more detail below.

Figure 6:
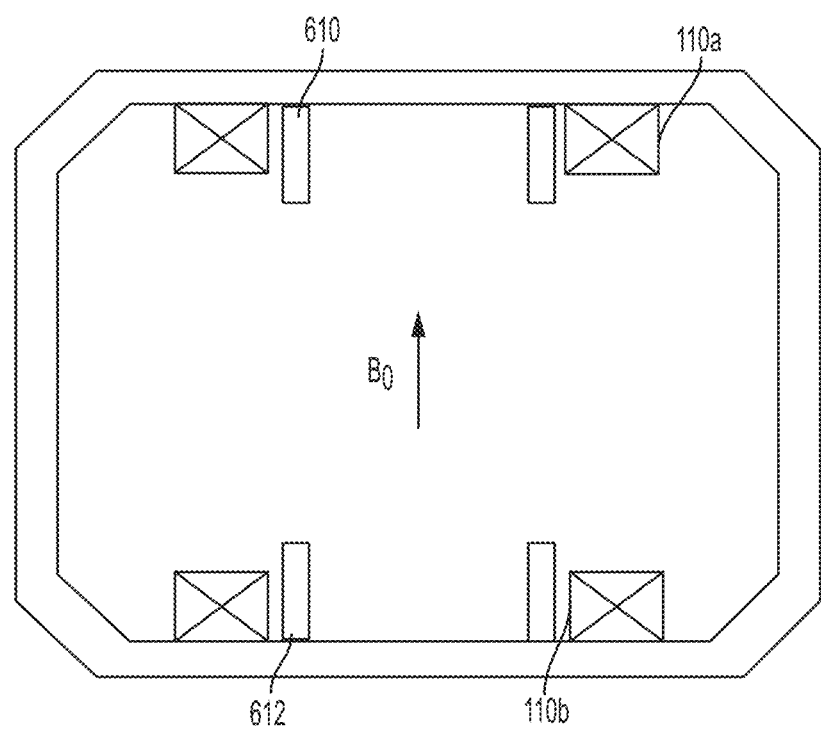
FIG. 6 shows a cross-section through a ferromagnetic augmentation device that includes shim rings in accordance with some embodiments.
Figure 7:
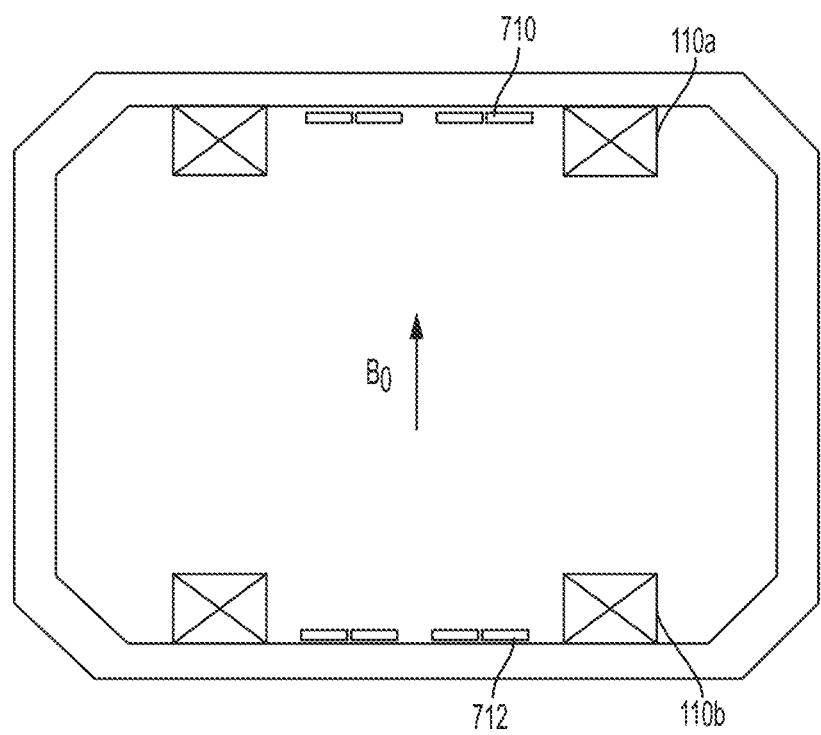
FIG. 7 shows a cross-section through a ferromagnetic augmentation device that includes shim material in accordance with some embodiments.

FIG. 6 shows a cross-section through a ferromagnetic structure including rings 610, 612 of ferromagnetic material arranged inside of coils 110*a*, 110*b* to improve the homogeneity of the $B_0$ field. Ferromagnetic rings 610, 612 change the homogeneity of the field by altering where the flux exits the ferromagnetic material and the direction of the flux lines as they exit the ferromagnetic material. FIG. 7 shows a cross-section through a ferromagnetic structure including multiple small ferromagnetic material pieces 710, 712. The size, location, and/or shape of the ferromagnetic pieces 710, 712 may be determined by simulation, measurement during fabrication, or in any other suitable way. For example, ferromagnetic pieces 710, 712 may comprise rings of material, small sections of material, or any other shape of material.

Figure 8:
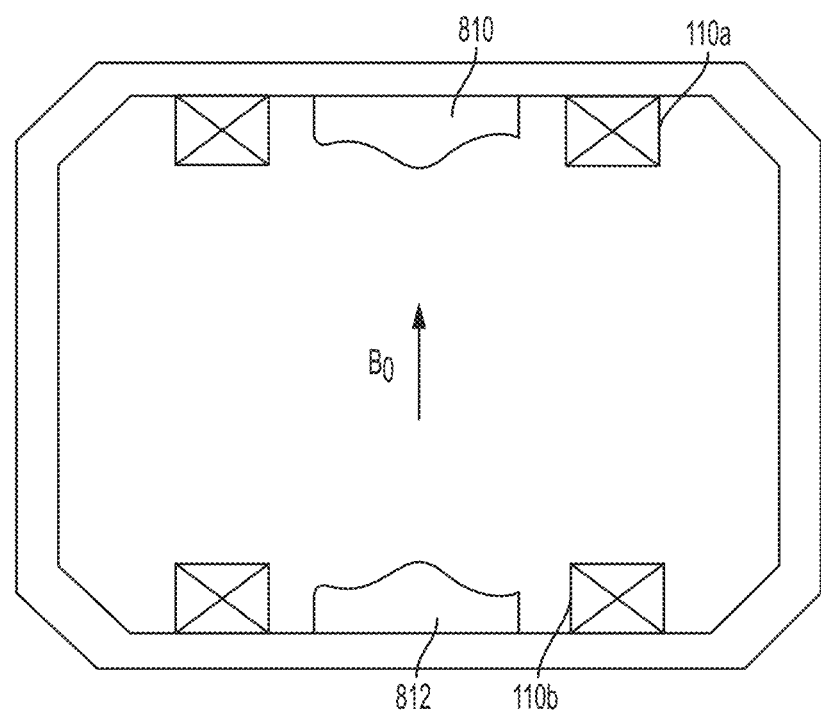
FIG. 8 shows a cross-section through a ferromagnetic augmentation device that includes pole plates in accordance with some embodiments.

FIG. 8 shows a cross section through another ferromagnetic structure including ferromagnetic pole pieces 810, 812. As shown, pole pieces 810 and 812 have a wavy shape. However, pole pieces 810, 812 may have any suitable shape, and aspects are not limited in this respect. The shape of the pole pieces 810, 812 may be determined in any suitable way including, but not limited to, using simulations or measurements during fabrication. In some embodiments, pole pieces 810, 812 are machined disks of ferromagnetic material (e.g., steel). Pole pieces 810, 812 may be machined from a solid piece of ferromagnetic material or may comprise multiple laminations of ferromagnetic material, as aspects are not limited in this respect.

The ferromagnetic structures illustrated in FIGS. 5-8 include ferromagnetic components that alter an inhomogeneous $B_0$ field produced by magnetic components of a low field MRI system. Although the various ferromagnetic components are illustrated as being included in separate figures, it should be appreciated that embodiments may include a single ferromagnetic component or any combination of electromagnetic or ferromagnetic components, as aspects are not limited in this respect. Additionally, each of the ferromagnetic components shown in FIGS. 5-8 is illustrated as being located between both of the coils in the pair of $B_0$ coils. However, in some embodiments, one or more ferromagnetic components may be located between only one of the coils of the pair and/or different ferromagnetic components may be located between the two coils of the pair, as aspects are not limited based on the particular combination and placement of ferromagnetic components included in ferromagnetic structures.

Additionally, the ferromagnetic structures shown in each of FIGS. 5-8 is illustrated as having a yoke with beveled corners to provide a low-reluctance path for returning flux in the yoke, as described above. However, it should be appreciated that ferromagnetic structure(s) configured to capture and return magnetic flux between the pair of $B_0$ coils including, but not limited to, the ferromagnetic structures shown in FIGS. 3 and 4, may alternatively be used alone or with any combination of the ferromagnetic structures shown in FIGS. 5-8, as aspects are not limited based on the particular combination of ferromagnetic structure and/or ferromagnetic components used.

Any suitable ferromagnetic materials may be used to fabricate ferromagnetic structure(s) for returning magnetic flux and/or ferromagnetic components for controlling the inhomogeneity of the $B_0$ field. For example, "electrical steels" or "magnet steels" of a particular grade may be used. Any grade of steel may be used including, but not limited to, low-grade (e.g., 1010) steel, higher-grade (e.g., 1005, 1006) steel with a lower carbon content, or any other grade of steel. Such grades of steel are commonly used, for example, for returning magnetic flux in transformers. Higher-grade steels, although more expensive, provide for a lighter weight design due to their increased saturation content. Materials other than steel may also be used as a ferromagnetic material in accordance with some embodiments. For example, higher-grade materials that have better controlled magnetic properties and/or higher magnetic permeability may additionally or alternatively be used as ferromagnetic materials in some embodiments.

In some embodiments, the ferromagnetic structure(s) used to return magnetic flux and one or more of the ferromagnetic components used to control the inhomogeneity of the $B_0$ field may be fabricated from different ferromagnetic materials. For example, the yoke used to return magnetic flux may be fabricated from iron, whereas the pole pieces used to control the inhomogeneity of the $B_0$ field may be fabricated from higher-grade materials that have better controlled magnetic properties and/or higher magnetic saturation levels to be able to tune the field more precisely.

The ferromagnetic structure(s) used to return magnetic flux and the one or more ferromagnetic components used to control the inhomogeneity of the $B_0$ field may be fabricated in any suitable way. Ferromagnetic structures used in transformers to return flux due to AC currents often use laminated structures to reduce power loss. Because low-field MRI systems generate magnetic flux in response to DC currents, at least a portion of one or more of the ferromagnetic structures for use with embodiments may be fabricated as a solid (e.g., non-laminated) piece of ferromagnetic material. For ease of manufacturing, the ferromagnetic structure(s) used to return magnetic flux between the $B_0$ coils may be fabricated in segments and be fastened together using any suitable fastening technique including, but not limited to, using dowels, bolts, joints, and welds. It should be appreciated that some fastening techniques (e.g., welding) are likely to change the magnetic properties of the ferromagnetic material and it may be advantageous to limit the use of such fastening techniques, if possible, to reduce variations in the homogeneity of the magnetic field.

In some embodiments, one or more ferromagnetic components may be formed as a laminated structure of plates of ferromagnetic material (e.g., steel). Any suitable thickness of a plate of ferromagnetic material may be used. For example, very thin plates to plates having a thickness of 1 inch or more may be used depending on the particular requirements of the implementation. The thickness of the ferromagnetic material(s) used in the ferromagnetic structure(s) configured to return flux between the coils may be chosen to achieve a cross-section sufficient to contain, without exceeding the saturation of the material(s), most or all of the flux generated by the coils that would have otherwise been lost to the environment in the absence of the ferromagnetic structure.

Although solid ferromagnetic structures may be used, laminated ferromagnetic structures provide some benefits for applications using low field MRI including, but not limited to, the ability to provide electrical isolation between laminations to reduce eddy currents generated in the ferromagnetic material during operation of the low field MRI system. Laminations may be fabricated using any suitable technique including, but not limited to, stamping, using water jet techniques, and using computerized numerical control (CNC) systems. One or more of the laminations used to fabricate the ferromagnetic components may be different from each other, and each of the laminations may be individually cut and stacked to form arbitrary shapes.

In some embodiments that use solid (e.g., non-laminated) pieces of ferromagnetic material to fabricate ferromagnetic components, other techniques, such as segmentation, may be used to reduce the effect of eddy currents flowing in the ferromagnetic material when the low field MRI system is in operation. In segmentation, cuts are made in the solid material to provide electrical isolation and to reduce eddy currents. Any suitable arrangement of cuts may be used to segment the solid material, and aspects are not limited in this respect. In some embodiments, the laminations and/or the cuts for the segmentation are designed to cancel a particular type of eddy current depending on the magnetic field pattern at the ferromagnetic region produced by the gradient coils and/or any other switching magnetic field.

In some embodiments, one or more of the ferromagnetic structures or components is designed to have a non-uniform thickness to reduce the weight of the component. For example, a component may have different thicknesses at different locations depending on whether the magnetic field is strong or weak at a particular location. For embodiments that include a yoke to return magnetic flux between the $B_0$ coils, the weight of yoke may substantially contribute to the overall weight of the low-field MRI system. To reduce this weight, portions of the yoke that have lower magnetic fields may be removed, whereas portions of the yoke that have higher magnetic fields may require the use of more ferromagnetic material to trap the magnetic flux.

In some embodiments, the ferromagnetic structure(s) used to return magnetic flux between the $B_0$ coils may also function as a support structure for the $B_0$ coils, thereby reducing the need to have a separate support structure, further reducing the weight of the low field MRI system. The ferromagnetic structure may also be used for other functions including, but not limited to, a structure for cable runs, cooling pipes, or other components of the low field MRI system.

In some embodiments, additional supporting structures may be used to provide mechanical support for the yoke or other ferromagnetic structure used to return magnetic flux. For example, vertical supports or other structures formed on the outside of the ferromagnetic structure may provide mechanical reinforcement. The additional supports may also add to the flux return capabilities of the ferromagnetic structure, thereby further improving the homogeneity of the $B_0$ field.

In some embodiments, the ferromagnetic structure used to return magnetic flux may also be used in provide RF shielding due to the opacity of the ferromagnetic structure to RF signals.

The inventor(s) have further appreciated that the ability to incorporate magnetic components in laminate panels in any desired arrangement or combination allows for numerous different geometries (e.g., of different shapes and/or sizes) to be realized to facilitate developing low-field MRI apparatus tailored for particular MRI applications. Moreover, the inventors have recognized that producing magnetics using laminate panels may facilitate the manufacture of relatively low cost and/or cartable or otherwise portable low-field MRI systems. Furthermore, producing magnetics in panel form allows for manufacture of foldable and/or deformable MRI magnetic components, which facilitates both portability/cartability as well as the ability to construct MRI magnetics specific for particular MRI applications or to facilitate imaging specific portions of the body, as discussed in further detail below. Thus, producing MRI magnetics (or portions thereof) using laminate panels as described herein has the ability to fundamentally change how MRI can be used in the medical or clinical setting and revolutionize the MRI industry with far-reaching impact, greatly expanding the circumstances and situations for which MRI can be utilized.

Figure 9A:
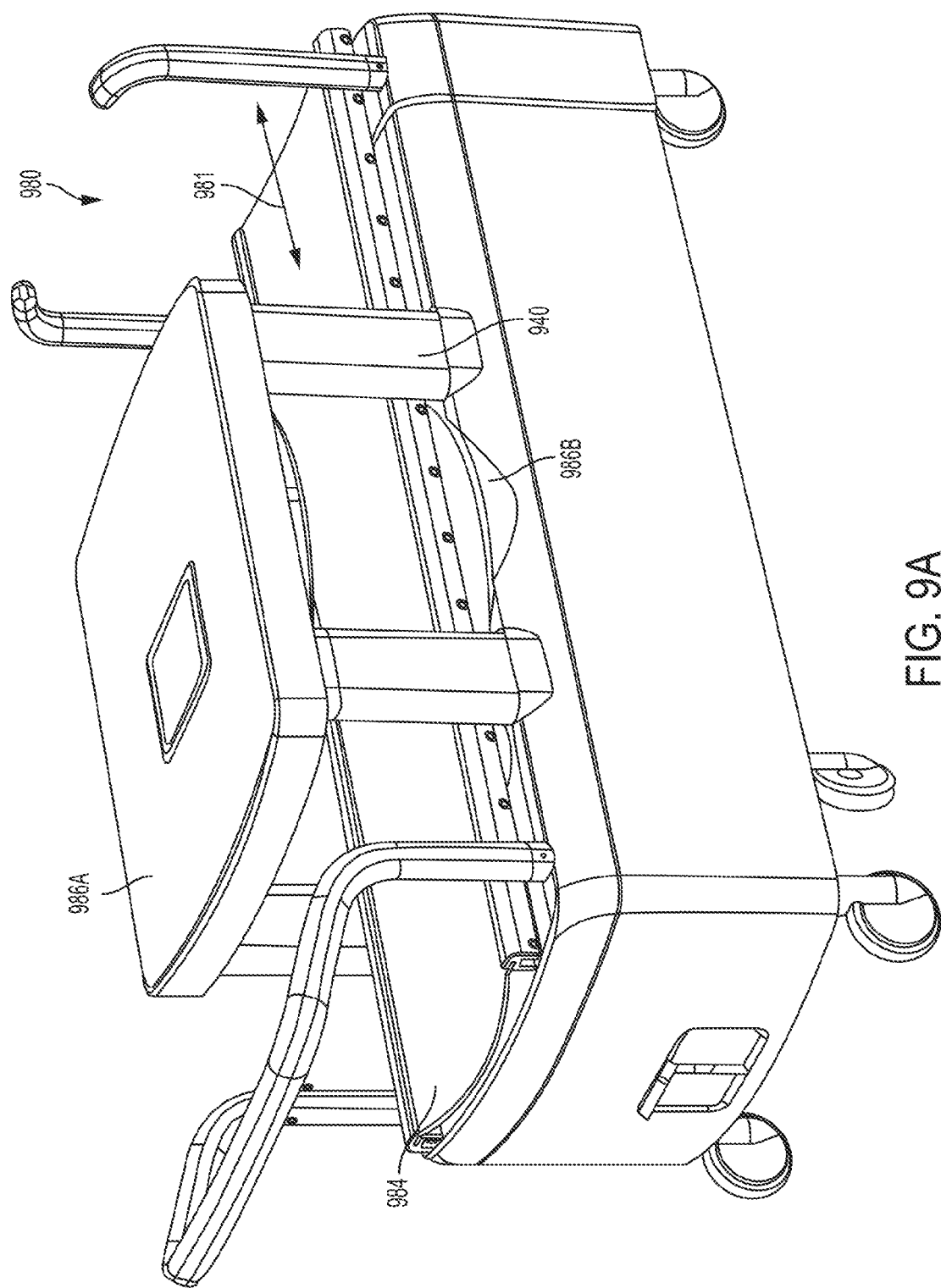
FIG. 9A illustrates an example of a convertible low-field MRI system, in a collapsed configuration, that incorporates ferromagnetic components in accordance with some embodiments.

FIG. 9A illustrates an example of a convertible low-field MRI system 980 that may incorporate one or more ferromagnetic augmentation structures or components described herein, in accordance with some embodiments. In FIG. 9A, the convertible system is in a collapsed configuration convenient for transporting the system or storing the system when it is not in use. Convertible system 980 includes a slide-able bed 984 configured to support a human patient and to allow the patient to be slid into and out from the imaging region between housings 986A and 986B in the direction of arrows 981. Housing 986A and 986B house magnetic components for the convertible system 900, as discussed in further detail below in connection the several views of the convertible system 980. The magnetic components may be produced, manufactured and arranged using any suitable technique or combination of techniques.

Separation between housings 986A and 986B is provided by support structures 940 shown in FIG. 9A as support columns. In some embodiments, one or more of support structures 940 may comprise ferromagnetic materials configured to form a magnetic circuit providing a return path for magnetic flux generated by magnetic components included in housings 986A, 986B, as described above. Alternatively, convertible system 980 may include one or more ferromagnetic structures other than support structures 940 that provide a magnetic circuit for returning flux to improve the homogeneity of the $B_0$ field generated by magnetic components housed in housings 986A and 986B.

Figure 9B:
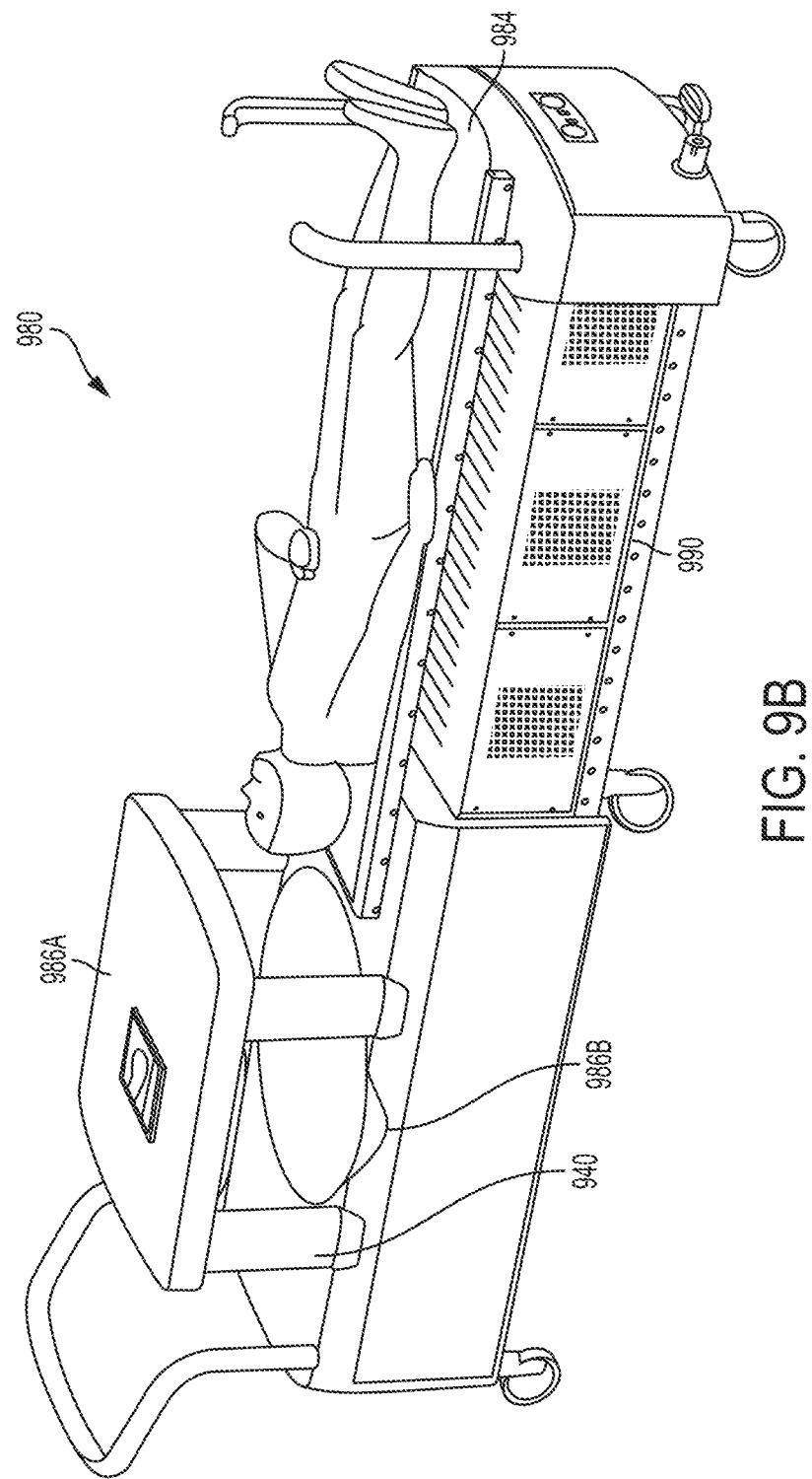
FIG. 9B illustrates the convertible low-field MRI system of FIG. 9A, in an extended configuration, in accordance with some embodiments.
Figure 9C:
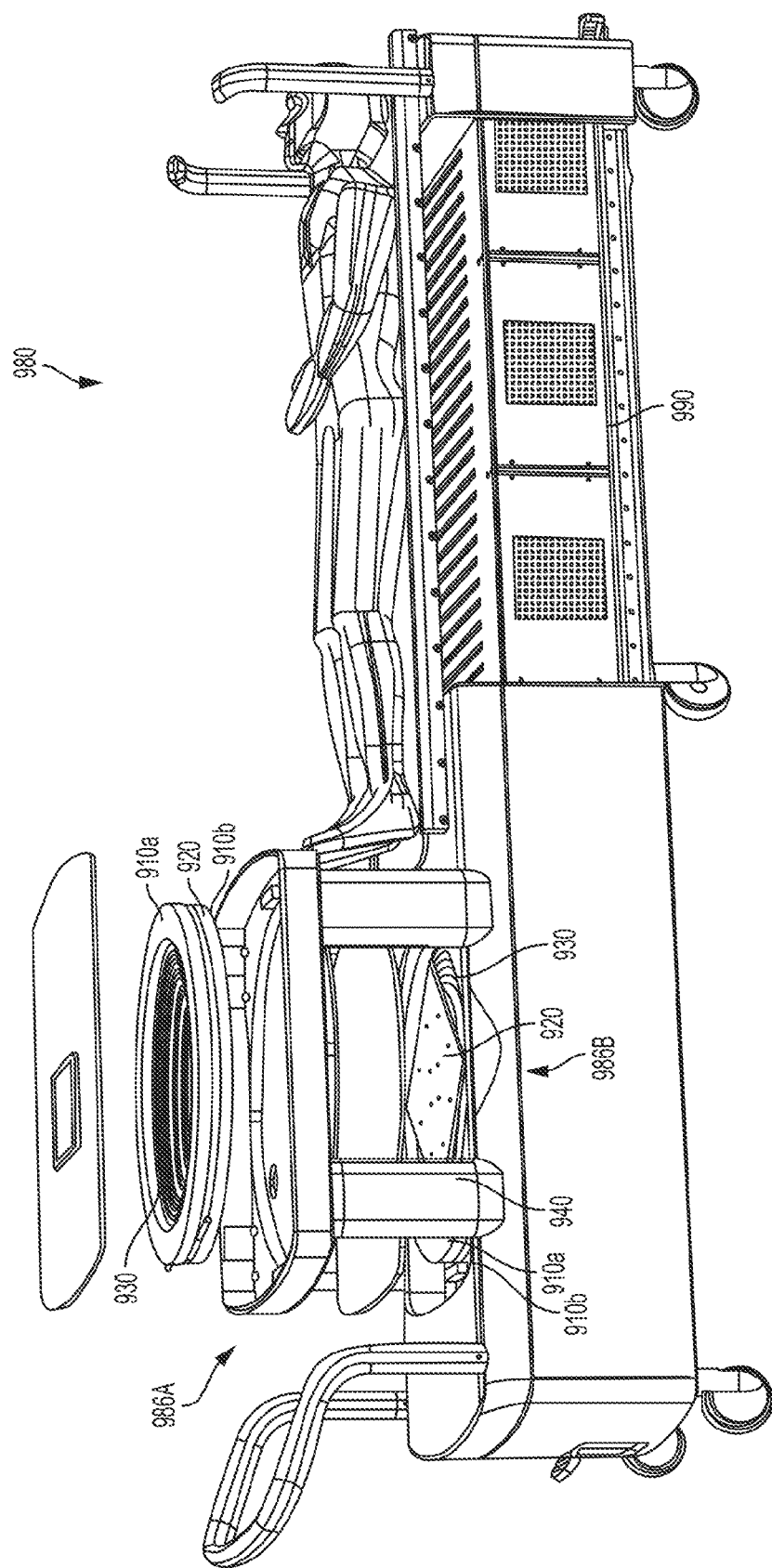
FIG. 9C illustrates the convertible low-field MRI system if FIG. 9A with an exploded view of the magnetic components, in accordance with some embodiments.

FIG. 9B illustrates convertible system 980 extended and with a patient positioned on slide-able bed 984 prior to being inserted between housings 986A and 986B to be imaged. FIG. 9C illustrates an exploded view of housings 986A and 986B. As shown, each of housings 986A and 986B houses magnetic components coupled to a thermal management component to draw heat away from the magnetic components. Specifically, each of housings 986A and 986B included therein $B_0$ coils 910a and 910b, laminate panel 920 (which is visible within housing 986B in the face-up arrangement) and thermal component 930 provided between the $B_0$ coils. In some embodiments, housings 986A and 986B may additionally include ferromagnetic components, examples of which are discussed above, to improve the homogeneity of the field generated by $B_0$ coils 910a and 910b. Any suitable number, type, and/or arrangement of ferromagnetic components may be include in housings 986A and 986B, and aspects are not limited in this respect.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A magnetic system for use in a magnetic resonance imaging system, the magnetic system comprising:
   at least one electromagnet configured to, when operated, generate a magnetic field to contribute to a $B_0$ field for the magnetic resonance imaging system, the electromagnet comprising at least one electromagnetic coil wound using a copper or aluminum conductor to generate a magnetic field; and
   at least one ferromagnetic component configured to capture and direct at least some of the magnetic field generated by the electromagnet to increase the magnetic flux density within an imaging region of the magnetic resonance imaging system,
   wherein the $B_0$ field generated is less than or equal to approximately 0.2T and greater than or equal to approximately 0.1T.

2. A magnetic system for use in a magnetic resonance imaging system, the magnetic system comprising:
- at least one electromagnet configured to, when operated, generate a magnetic field to contribute to a $B_0$ field for the magnetic resonance imaging system, the electromagnet comprising at least one electromagnetic coil wound using a copper or aluminum conductor to generate a magnetic field; and
- at least one ferromagnetic component configured to capture and direct at least some of the magnetic field generated by the electromagnet to increase the magnetic flux density within an imaging region of the magnetic resonance imaging system,
- wherein the $B_0$ field generated is less than or equal to approximately 0.1T and greater than or equal to approximately 50 mT.

3. A The magnetic system of claim 2 for use in a magnetic resonance imaging system, the magnetic system comprising:
- at least one electromagnet configured to, when operated, generate a magnetic field to contribute to a $B_0$ field for the magnetic resonance imaging system, the electromagnet comprising at least one electromagnetic coil wound using a copper or aluminum conductor to generate a magnetic field; and
- at least one ferromagnetic component configured to capture and direct at least some of the magnetic field generated by the electromagnet to increase the magnetic flux density within an imaging region of the magnetic resonance imaging system,
- wherein the $B_0$ field generated is less than or equal to approximately 50 mT and greater than or equal to approximately 20 mT.

4. A magnetic system for use in a magnetic resonance imaging system, the magnetic system comprising:
- at least one electromagnet configured to, when operated, generate a magnetic field to contribute to a $B_0$ field for the magnetic resonance imaging system, the electromagnet comprising at least one electromagnetic coil wound using a copper or aluminum conductor to generate a magnetic field; and
- at least one ferromagnetic component configured to capture and direct at least some of the magnetic field generated by the electromagnet to increase the magnetic flux density within an imaging region of the magnetic resonance imaging system,
- wherein the $B_0$ field generated is less than or equal to approximately 20 mT and greater than or equal to approximately 10 mT.

5. A magnetic system for use in a magnetic resonance imaging system, the magnetic system comprising:
- at least one electromagnet configured to, when operated, generate a magnetic field to contribute to a $B_0$ field for the magnetic resonance imaging system, the electromagnet comprising at least one electromagnetic coil wound using a copper or aluminum conductor to generate a magnetic field, wherein the at least one electromagnet comprises a pair of $B_0$ coils including a first $B_0$ coil and a second $B_0$ coil arranged in a bi-planar configuration;
- at least one ferromagnetic component configured to capture and direct at least some of the magnetic field generated by the electromagnet to increase the magnetic flux density within an imaging region of the magnetic resonance imaging system, wherein the at least one ferromagnetic component is configured to increase the field strength and/or alter the homogeneity of the $B_0$ field in the imaging region between the first $B_0$ coil and the second $B_0$ coil; and
- at least one laminate panel having at least one electromagnetic component fabricated thereon, wherein the at least one laminate panel comprises at least one x-gradient coil, at least one y-gradient coil, and at least one z-gradient coil to provide spatial encoding in x, y, and z directions, respectively.

6. The magnetic system of claim 5, wherein the at least one ferromagnetic component comprises a ferromagnetic structure connected to the first $B_0$ coil and the second $B_0$ coil to form a magnetic circuit that provides at least one return path for magnetic flux generated by the first $B_0$ coil and the second $B_0$ coil through the ferromagnetic structure.

7. The magnetic system of claim 6, wherein the ferromagnetic structure provides the at least one return path for magnetic flux along at least one side of the ferromagnetic structure.

8. The magnetic system of claim 7, wherein the ferromagnetic structure provides a plurality of return paths for magnetic flux along sides of the ferromagnetic structure.

9. The magnetic system of claim 7, wherein the ferromagnetic structure comprises a C-shaped ferromagnetic structure that provides a return path for magnetic flux along only one side of the ferromagnetic structure.

10. The magnetic system of claim 6, wherein the ferromagnetic structure comprises at least one beveled corner to reduce a magnetic reluctance around the at least one beveled corner.

11. The magnetic system of claim 6, wherein the ferromagnetic structure comprises a plurality of ferromagnetic posts configured to provide the at least one return path for magnetic flux.

12. The magnetic system of claim 11, wherein at least one of the plurality of ferromagnetic posts is removable from the low-field MRI system.

13. The magnetic system of claim 6, wherein the at least one ferromagnetic component further comprises at least one first ferromagnetic component located adjacent to the first $B_0$ coil and/or the second $B_0$ coil to alter where the magnetic flux exits the ferromagnetic structure.

14. The magnetic system of claim 13, wherein the ferromagnetic structure comprises a first ferromagnetic material and wherein the at least one first ferromagnetic component located adjacent to the first $B_0$ coil and/or the second $B_0$ coil comprises a second ferromagnetic material different than the first ferromagnetic material.

15. The magnetic system of claim 5, wherein the at least one ferromagnetic component comprises one or more solid ferromagnetic components.

16. The magnetic system of claim 5, wherein the at least one laminate panel comprises at least one $B_0$ coil and/or at least one shim coil.

17. The magnetic system of claim 5, wherein the at least one ferromagnetic component comprises at least one shim ring located adjacent to the first $B_0$ coil and/or the second $B_0$ coil.

18. The magnetic system of claim 5, wherein the at least one ferromagnetic component comprises a plurality of ferromagnetic shim pieces located adjacent to the first $B_0$ coil and/or the second $B_0$ coil.

19. The magnetic system of claim 5, wherein the at least one ferromagnetic component comprises at least one ferromagnetic pole piece located adjacent to the first $B_0$ coil and/or the second $B_0$ coil.

20. The magnetic system of claim 19, wherein the at least one ferromagnetic pole piece comprises a pole piece having a non-rectangular shape.

21. The magnetic system of claim 5, wherein the at least one ferromagnetic component is configured to provide a support structure that provides support for the first $B_0$ coil and/or the second $B_0$ coil.

22. The magnetic system of claim 5, wherein the at least one ferromagnetic component comprises a plurality of electrically isolated segments to reduce eddy currents generated in the at least one ferromagnetic component.

23. The magnetic system of claim 5, wherein the at least one ferromagnetic component has a non-uniform thickness to reduce a weight of the at least one ferromagnetic component.

24. The magnetic system of claim 5, further comprising at least one support structure formed on a surface of the at least one ferromagnetic component.

25. The magnetic system of claim 5, wherein the at least one laminate panel comprises at least one $B_0$ coil configured to contribute to the $B_0$ magnetic field.

26. The magnetic system of claim 5, wherein the at least one laminate panel comprises a first laminate panel and a second laminate panel arranged in a bi-planar configuration.

\* \* \* \* \*

UNITED STATES PATENT AND TRADEMARK OFFICE
CERTIFICATE OF CORRECTION

| | | |
|---|---|---|
| PATENT NO. | : 9,638,773 B2 | Page 1 of 1 |
| APPLICATION NO. | : 14/846255 | |
| DATED | : May 2, 2017 | |
| INVENTOR(S) | : Michael Stephen Poole et al. | |

It is certified that error appears in the above-identified patent and that said Letters Patent is hereby corrected as shown below:

In the Claims

Column 19, Claim 3, Line 18:

"A The magnetic system of claim 2 for use in a magnetic"

Should read:

-- A magnetic system for use in a magnetic --

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*